(12) United States Patent
Yamazaki et al.

(10) Patent No.: US 8,451,003 B2
(45) Date of Patent: May 28, 2013

(54) MAGNETIC SENSOR HAVING MAGNETO-RESISTIVE ELEMENTS ON A SUBSTRATE

(75) Inventors: Hiroshi Yamazaki, Tokyo (JP); Hiraku Hirabayashi, Tokyo (JP); Naoki Ohta, Tokyo (JP)

(73) Assignee: TDK Corporation, Tokyo (JP)

( * ) Notice: Subject to any disclaimer, the term of this patent is extended or adjusted under 35 U.S.C. 154(b) by 359 days.

(21) Appl. No.: 12/844,091

(22) Filed: Jul. 27, 2010

(65) Prior Publication Data

US 2011/0025321 A1 Feb. 3, 2011

(30) Foreign Application Priority Data

Jul. 29, 2009 (JP) ................................. 2009-176828

(51) Int. Cl.
*G01R 33/09* (2006.01)
(52) U.S. Cl.
USPC .......................................................... 324/252
(58) Field of Classification Search
USPC .......................................................... 324/252
See application file for complete search history.

(56) References Cited

U.S. PATENT DOCUMENTS

| | | | |
|---|---|---|---|
| 5,621,377 A | 4/1997 | Dettmann et al. | |
| 6,329,818 B1 | 12/2001 | Tokunaga et al. | |
| 6,640,652 B2 | 11/2003 | Kikuchi et al. | |
| 7,312,609 B2 * | 12/2007 | Schmollngruber et al. | .. 324/252 |
| 7,394,247 B1 | 7/2008 | Guo et al. | |
| 2002/0149358 A1 | 10/2002 | Doescher | |
| 2003/0070497 A1 | 4/2003 | Kikuchi et al. | |
| 2003/0128031 A1 * | 7/2003 | Doescher | ...................... 324/252 |
| 2008/0116886 A1 | 5/2008 | Yamada et al. | |

FOREIGN PATENT DOCUMENTS

| | | |
|---|---|---|
| JP | A-2000-35470 | 2/2000 |
| JP | A-2001-159542 | 6/2001 |
| JP | A-2002-303536 | 10/2002 |
| JP | A-2003-121197 | 4/2003 |
| JP | A-2005-534199 | 11/2005 |
| JP | A-2009-20092 | 1/2009 |
| WO | WO 2006/101981 A1 | 9/2006 |

OTHER PUBLICATIONS

European Search Report dated Oct. 20, 2010 in European Patent Application No. 10007855.9.
European Office Action issued in European Application No. 10 007 855.9 dated Nov. 21, 2011.

* cited by examiner

*Primary Examiner* — Jay Patidar
(74) *Attorney, Agent, or Firm* — Oliff & Berridge, PLC

(57) ABSTRACT

A magnetic sensor having first to fourth magneto-resistive elements, where the first and second magneto-resistive elements are connected at respective ends through a first connecting portion in a central region, and the third and fourth magneto-resistive elements are connected at respective ends through a second connecting portion that is parallel to the first connecting portion. The first and fourth magneto-resistive elements are connected at respective other ends through a third connecting portion, and the second and third magneto-resistive elements are connected at respective other ends through a fourth connecting portion. Depending on an external signal magnetic field, resistance values of the first and third magneto-resistive elements change in a same increasing or decreasing direction, whereas resistance values of the second and fourth magneto-resistive elements change in an increasing or decreasing direction opposite to the direction of the first and third magneto-resistive elements.

17 Claims, 11 Drawing Sheets

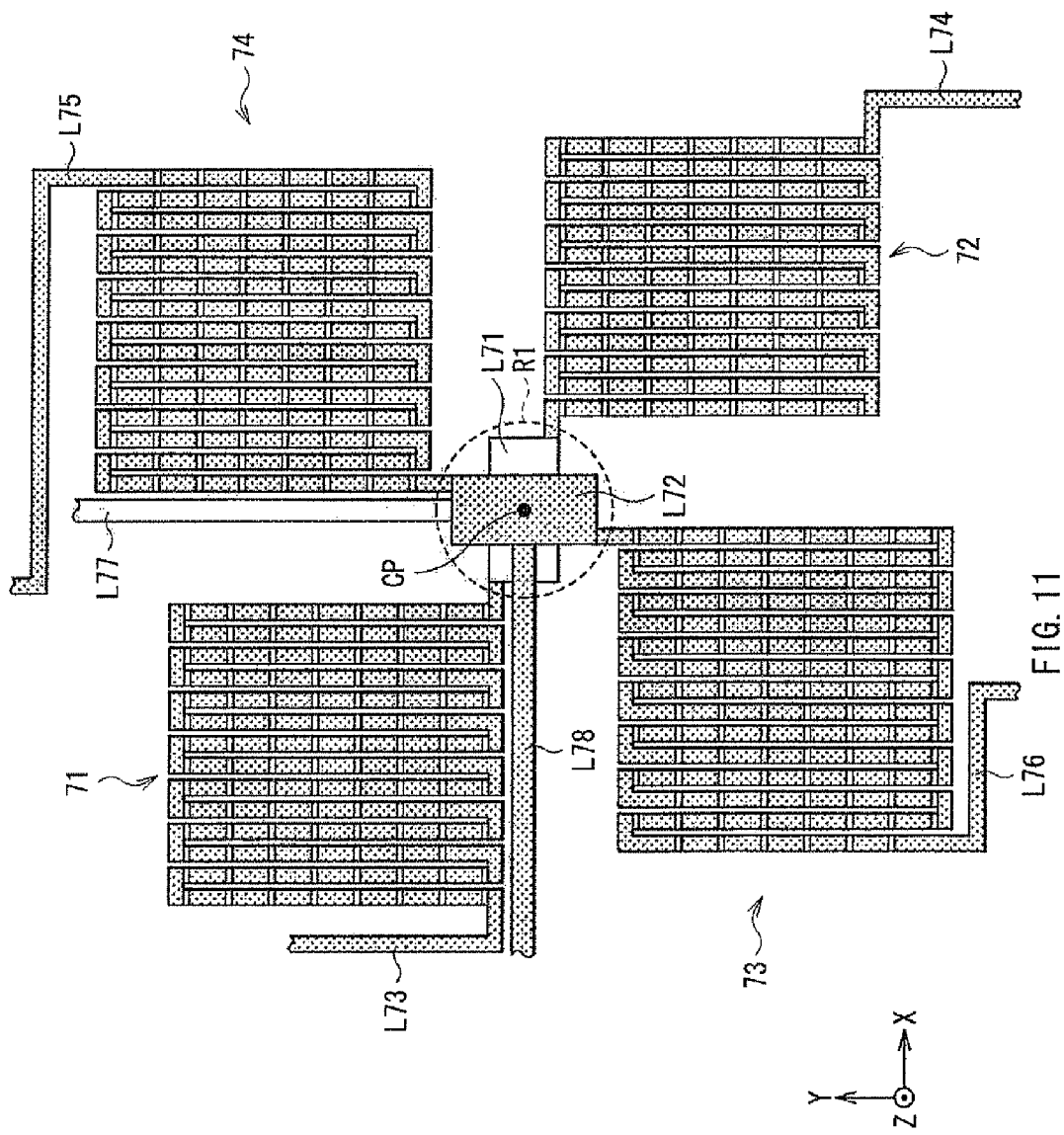

MAGNETIC SENSOR HAVING MAGNETO-RESISTIVE ELEMENTS ON A SUBSTRATE

BACKGROUND OF THE INVENTION

1. Field of the Invention

The invention relates to a magnetic sensor capable of detecting a change in a magnetic field with high sensitivity.

2. Description of the Related Art

Generally, to accurately detect a weak control current flowing through a circuit in a control apparatus, a method of connecting resisters in series in the circuit and measuring a voltage drop of the resisters is used. However, in this case, a load different from that of a control system is applied and any adverse affect may occur to the control system. Accordingly, a method of indirectly measuring a control current by detecting the gradient of the induction magnetic field generated by the control current has been used. In particular, a magnetic sensor in which giant magneto-resistive elements (hereinafter, GMR element) expressing giant magneto-resistive effect are arranged in the induction magnetic field by the control current to detect the gradient has been proposed (for example, see U.S. Pat. No. 5,621,377).

In a related matter, a technique that uses a magnetic sensor having GMR elements to perform flaw detection on a surface of a metallic substrate and the like has been proposed. Furthermore, as an angle sensor that measures a direction of the geomagnetism or a rotational angle of rotating magnetic flux on a certain plane, some magnetic sensor using GMR elements has been developed (see Japanese Patent Application Laid-open Nos. 2000-35470 and 2002-303536, Japanese Unexamined Patent Application Publication No. 2005-534199, for example). Such a magnetic sensor using GMR elements can relatively improve detection sensitivity and responsibility and can provide stable detection property against a change of temperature. Specifically, by detecting an induction magnetic field using a Wheatstone bridge circuit that includes four GMR elements, sensitivity and accuracy can be further improved compared with the case where only one GMR element is used.

SUMMARY OF THE INVENTION

However, there is a need for a highly integrated magnetic sensor that retains detection property because the demand for smaller and lighter magnetic sensor has increased.

It is desirable to provide a magnetic sensor having more compact configuration without deteriorating detection property of a magnetic field and operation reliability.

A magnetic sensor according to an embodiment of the invention includes a bridge circuit including first to fourth magneto-resistive elements arranged on a substrate so as to surround a central region, wherein one end of the first magneto-resistive element and one end of the second magneto-resistive element are connected to each other through a first connecting portion extending in the central region positioned between the first magneto-resistive element and the second magneto-resistive element, one end of the third magneto-resistive element and one end of the fourth magneto-resistive element are connected to each other through a second connecting portion that crosses the first connecting portion with a distance in a thickness direction in the central region positioned between the third magneto-resistive element and the fourth magneto-resistive element, other end of the first magneto-resistive element is connected to other end of the fourth magneto-resistive element through a third connecting portion, other end of the second magneto-resistive element is connected to other end of the third magneto-resistive element through a fourth connecting portion, resistance values of the first and third magneto-resistive elements change in a same increasing/decreasing direction depending on a change of an external signal magnetic field, and resistance values of the second and fourth magneto-resistive elements change in a increasing/decreasing direction opposite to that of the first and third magneto-resistive elements depending on the change of the signal magnetic field.

As used herein, the term "the change of the signal magnetic field" refers to a change in a magnitude of the signal magnetic field and a change (rotation) in a direction of the signal magnetic field relative to each magneto-resistive element.

According to the magnetic sensor of the embodiment of the invention, the first connecting portion and the second connecting portion cross each other with the distance in the thickness direction in the central region positioned between each pair of the first to fourth magneto-resistive elements. Consequently, the lengths in an in-plane direction of the first and second connecting portions are shortened compared with the case where the first connecting portion does not cross the second connecting portion.

Advantageously, a difference detecting section detecting a potential difference between the first connecting portion and the second connecting portion when a voltage is applied between the third connecting portion and the fourth connecting portion may be further included.

Advantageously, an angle calculating circuit calculating a rotational angle of the signal magnetic field based on potentials at the first and the second connecting portions when a voltage is applied between the third connecting portion and the fourth connecting portion may be further included.

A magnetic sensor according to an embodiment of the invention includes first to eighth magneto-resistive elements arranged on a substrate so as to surround a central region, the first to fourth magneto-resistive elements configuring a first bridge circuit, the fifth to eighth magneto-resistive elements configuring a second bridge circuit, wherein one end of the first magneto-resistive element and one end of the second magneto-resistive element are connected to each other through a first connecting portion extending in the central region positioned between the first magneto-resistive element and the second magneto-resistive element, one end of the third magneto-resistive element and one end of the fourth magneto-resistive element are connected to each other through a second connecting portion extending in the central region positioned between the third magneto-resistive element and the fourth magneto-resistive element, other end of the first magneto-resistive element is connected to other end of the fourth magneto-resistive element through a third connecting portion, other end of the second magneto-resistive element is connected to other end of the third magneto-resistive element through a fourth connecting portion, resistance value of the first and third magneto-resistive elements changes in a same increasing/decreasing direction depending on a change of an external signal magnetic field, resistance value of the second and fourth magneto-resistive elements changes in a increasing/decreasing direction opposite to that of the first and third magneto-resistive elements depending on the change of the signal magnetic field, one end of the fifth magneto-resistive element and one end of the sixth magneto-resistive element are connected to each other through a fifth connecting portion that crosses the first and second connecting portion with a distance in a thickness direction in the central region positioned between the fifth magneto-resistive element and the sixth magneto-resistive element, one end of the seventh magneto-resistive element and one end of the eighth magneto-resistive element are connected to each other through a sixth connecting portion that crosses the first and second connecting portion with a distance in a thickness direction in the central region positioned between the seventh magneto-resistive element and the eighth magneto-resistive element, other end of the fifth magneto-resistive element is connected to other end of the eighth magneto-resistive element through a seventh connecting portion, other end of the sixth magneto-resistive element is connected to other end of the seventh magneto-resistive element through a eighth connecting portion, resistance values of the fifth and seventh magneto-resistive elements change in a same increasing/decreasing direction depending on the change of the signal magnetic field, and resistance values of the sixth and eighth magneto-resistive elements change in a increasing/decreasing direction opposite to that of the fifth and seventh magneto-resistive elements depending on the change of the signal magnetic field.

According to the magnetic sensor of the embodiment of the invention, the first and second connecting portions cross the fifth and sixth connecting portions with a distance in a thickness direction in the central region positioned between each pair of the first to eighth magneto-resistive elements. Consequently, the lengths in an in-plane direction of the first, second, fifth, and sixth connecting portions are shortened compared with the case where the first and second connecting portions do not cross the fifth and sixth connecting portions.

Advantageously, a difference detecting section detecting a first differential signal based on a potential difference between the first connecting portion and the second connecting portion when a voltage is applied between the third connecting portion and the fourth connecting portion, as well as detecting a second differential signal based on a potential difference between the fifth connecting portion and the sixth connecting portion when a voltage is applied between the seventh connecting portion and the eighth connecting portion may be further included.

Advantageously, an angle calculating circuit calculating a rotational angle of the signal magnetic field, based on potentials at the first and second connecting portion when a voltage is applied between the third connecting portion and the fourth connecting portion, and based on potentials at the fifth and sixth connecting portions when a voltage is applied between the seventh connecting portion and the eighth connecting portion.

Advantageously, each of the first to eighth connecting portions is configured of a single straight-line segment, or combination of a plurality of straight-line segments connected so as to be mutually orthogonal.

Advantageously, the first and second connecting portions extend in parallel to each other, the fifth and sixth connecting portions extend in a direction orthogonal to the first and second connecting portions.

Advantageously, the first to eighth magneto-resistive elements are positioned at a same distance from the central point of the central region. This makes it possible for the external signal magnetic field to be more equivalently applied to the first to eighth magneto-resistive elements.

Advantageously, the first and third magneto-resistive elements are diagonally positioned with reference to the central point of the central region, the second and fourth magneto-resistive elements are diagonally positioned with reference to the central point of the central region, the fifth and seventh magneto-resistive elements are diagonally positioned with reference to the central point of the central region, and the sixth and eighth magneto-resistive elements are diagonally positioned with reference to the central point of the central region. This provides a superior magnetic symmetric property relating to the change of the signal magnetic field.

Advantageously, each of the first to eighth magneto-resistive elements includes a plurality of magneto-resistive films arranged on the substrate and conductors connecting the magneto-resistive films in series. The conductors include a plurality of upper electrodes and lower electrodes, in which each pair of an upper electrode and an lower electrode, in the plurality of upper electrodes and lower electrodes, sandwich a respective magneto-resistive film in a layer stacking direction so that the upper electrode and the lower electrode face each other and are in contact with an upper surface and a bottom surface of each magneto-resistive film, respectively. By connecting the magneto-resistive films in series, the amount of resistance change of each magneto-resistive film are added when the signal magnetic field changes, and therefore the total amount of resistance change becomes large. Also, the magneto-resistive films are connected by the upper electrodes and the lower electrodes that sandwich each magneto-resistive film in the thickness direction, so that an induction magnetic field generated by a current flowing the upper electrodes and an induction magnetic field generated by a current flowing the lower electrodes are cancelled from each other. In particular, each of the upper electrode and the lower electrode extends along an arrangement direction of magneto-resistive films. This makes it possible to more effectively cancel the induction magnetic field.

Advantageously, a first lead line having one end connected to the first connecting portion, a second lead line having one end connected to the second connecting portion, a third lead line having one end connected to the fifth connecting portion, and a fourth lead line having one end connected to the sixth connecting portion, are further included, in which one of the first and second lead lines extends between the fifth magneto-resistive element and the eighth magneto-resistive element, and other of the first and second lead lines extends between the sixth magneto-resistive element and the seventh magneto-resistive element, and one of the third and fourth lead lines extends between the first magneto-resistive element and the fourth magneto-resistive element, and other of the third and fourth lead lines extends between the second magneto-resistive element and the third magneto-resistive element.

Advantageously, the first and second lead lines are positioned on a same straight line, the third and fourth lead lines are positioned on a same straight line orthogonal to the first and second lead lines, the magneto-resistive films in the first to fourth magneto-resistive elements are connected to one another along a direction where the third and fourth lead lines extend, and the magneto-resistive films in the fifth to eighth magneto-resistive elements are connected to one another along a direction where the first and second lead lines extend. This makes it possible to reduce the variation of the resistance change of each magneto-resistive element with respect to the change of the signal magnetic field, the detection property is improved, and it is advantageous in compactification.

A magnetic sensor according to an embodiment of the invention includes first to fourth magneto-resistive elements arranged on a substrate so as to surround a central region, wherein one end of the first magneto-resistive element and one end of the second magneto-resistive element are connected to each other through a first connecting portion extending in the central region positioned between the first magneto-resistive element and the second magneto-resistive element, one end of the third magneto-resistive element and one end of the fourth magneto-resistive element are connected to each other through a second connecting portion that crosses the first connecting portion with a distance in a thickness direction in the central region positioned between the third magneto-resistive element and the fourth magneto-resistive element, other end of the first magneto-resistive element and other end of the third magneto-resistive element are both connected to a power source, other end of the second magneto-resistive element and other end of the fourth magneto-resistive element are both grounded, a resistance value of the first magneto-resistive element changes in an increasing/decreasing direction opposite to that of the second magneto-resistive elements depending on a change of an external signal magnetic field, and a resistance value of the third magneto-resistive element changes in an increasing/decreasing direction opposite to that of the fourth magneto-resistive elements depending on the change of the signal magnetic field.

According to the magnetic sensor of the embodiment of the invention, the first connecting portion crosses the second connecting portion with a distance in the thickness direction in the central region positioned between each pair of the first to fourth magneto-resistive elements. Thus, the lengths of the first and second connecting portions in an in-plane direction are shortened compared with the case where the first connecting portion does not cross the second connecting portion.

Advantageously, an angle calculating circuit calculating a rotational angle of the signal magnetic field, based on a potential at the first connecting portion when a voltage is applied between other end of the first magneto-resistive element and other end of the second magneto-resistive element, and based on a potential at the second connecting portion when a voltage is applied between other end of the third magneto-resistive element and other end of the fourth magneto-resistive element may be further included.

According to the embodiments of the magnetic sensor of the invention, the connecting portions that connect the magneto-resistive elements are crossed with each other with a distance in the thickness direction in the central region. As a result, the lengths of the connecting portions can be shortened compared with the case where the connecting portions are all provided in the outer region of the magneto-resistive elements. Consequently, the magnetic sensor advantageously reduces the resistance of the connecting portions and the relative variation of resistance. The magnetic sensor can be downsized in the entire configuration while maintaining good detection property of the signal magnetic field and good operation reliability.

In particular, each magneto-resistive element may be provided at the same position from each other so as to surround the central region. Thus, when the signal magnetic field rotates around the central point included in the central region in the surface in parallel to the substrate, the variation of the detection sensitivity and the detection accuracy due to the rotational angle (direction) of the signal magnetic field can be reduced, thereby improving the operation reliability.

BRIEF DESCRIPTION OF THE DRAWINGS

FIG. 11 is a plane view illustrating a detail of a key configuration of the magnetic sensor illustrated in FIG. 10.

DETAILED DESCRIPTION OF THE PREFERRED EMBODIMENTS

Preferred embodiments of the invention will be described in detail with reference to the accompanying drawings.

[First Embodiment]

Figure 1:
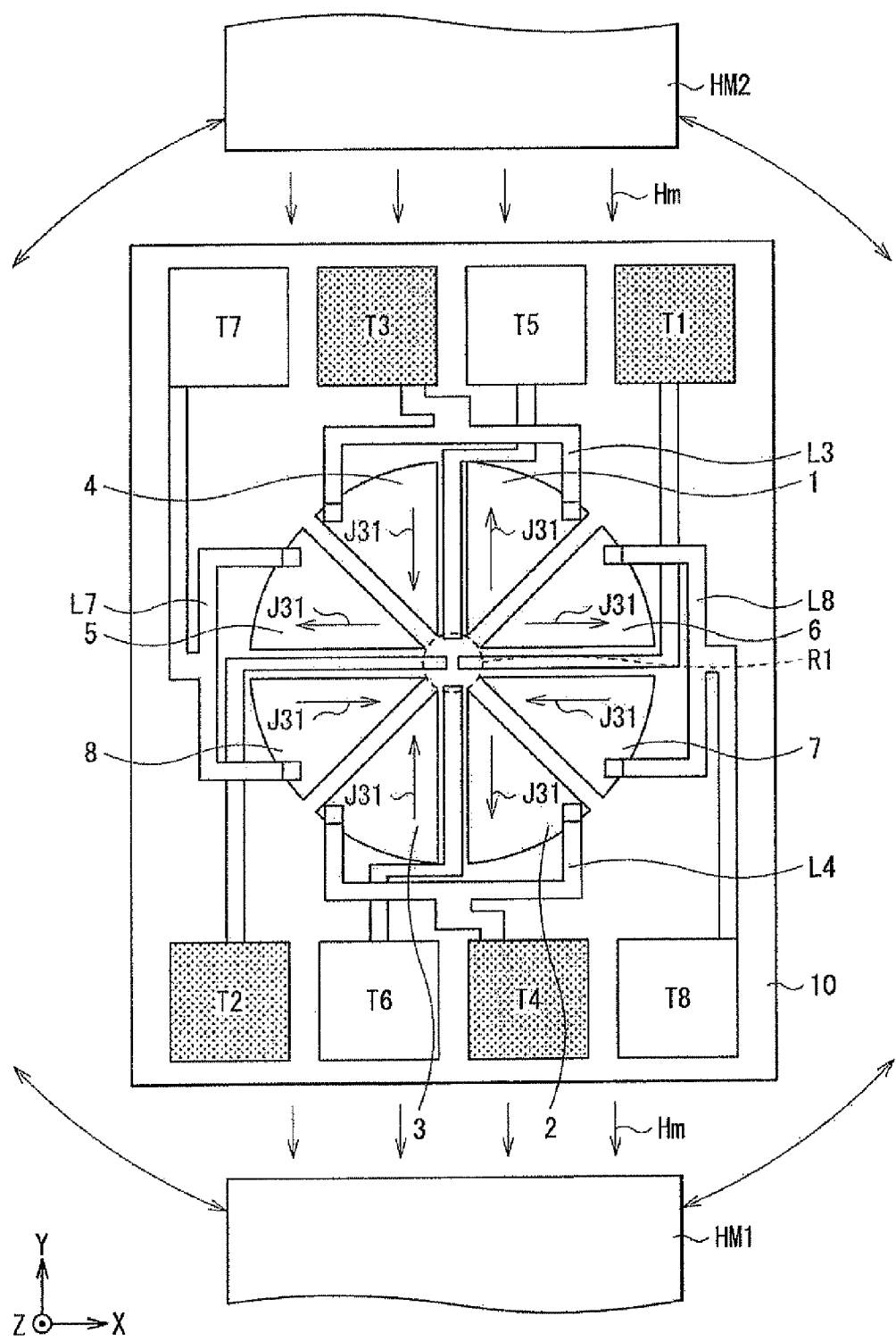
FIG. 1 is a schematic view showing an entire configuration of a magnetic sensor as a first embodiment of the invention.
Figure 2:
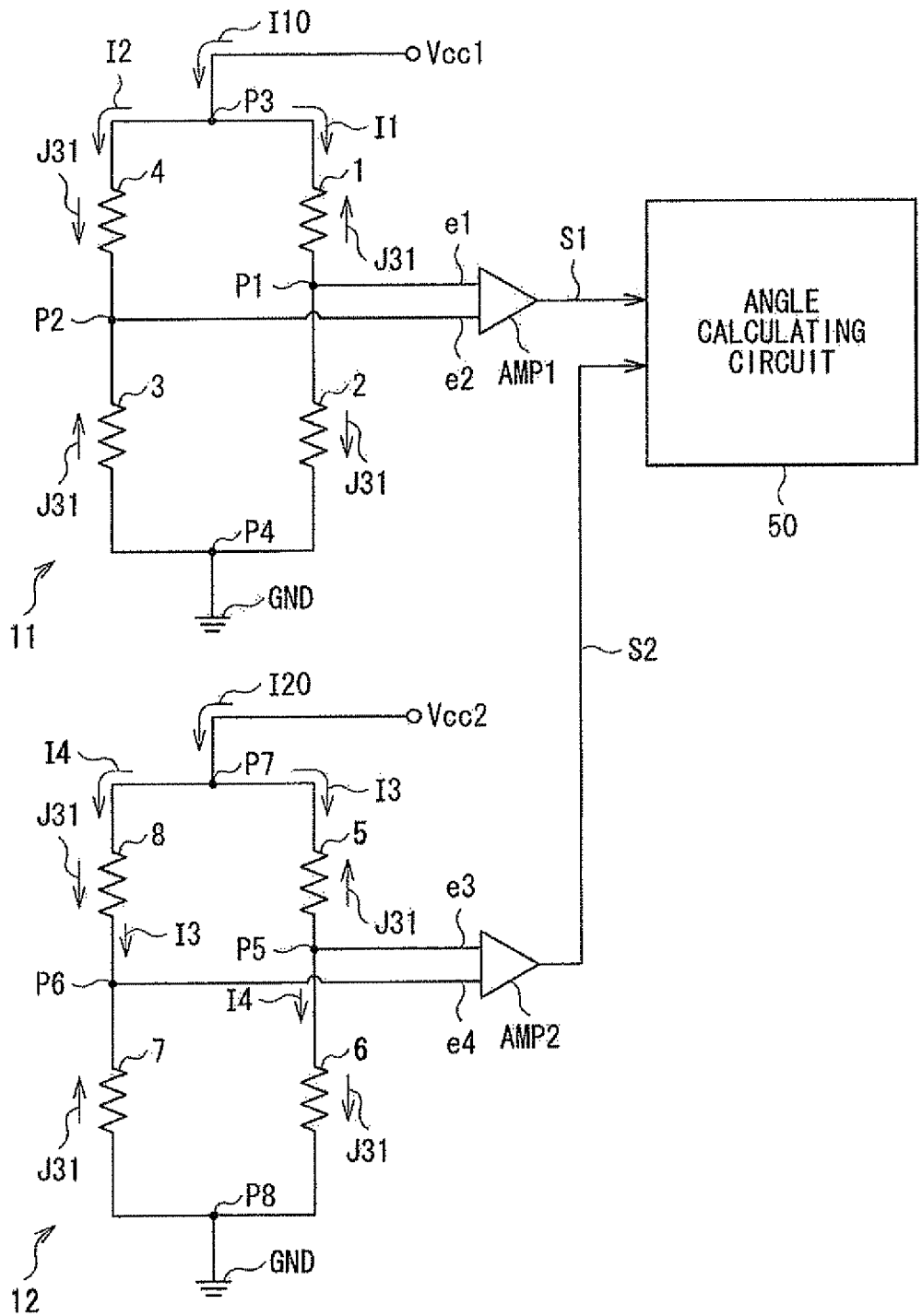
FIG. 2 is a circuit diagram showing a circuit configuration of the magnetic sensor shown in FIG. 1.
Figure 3:
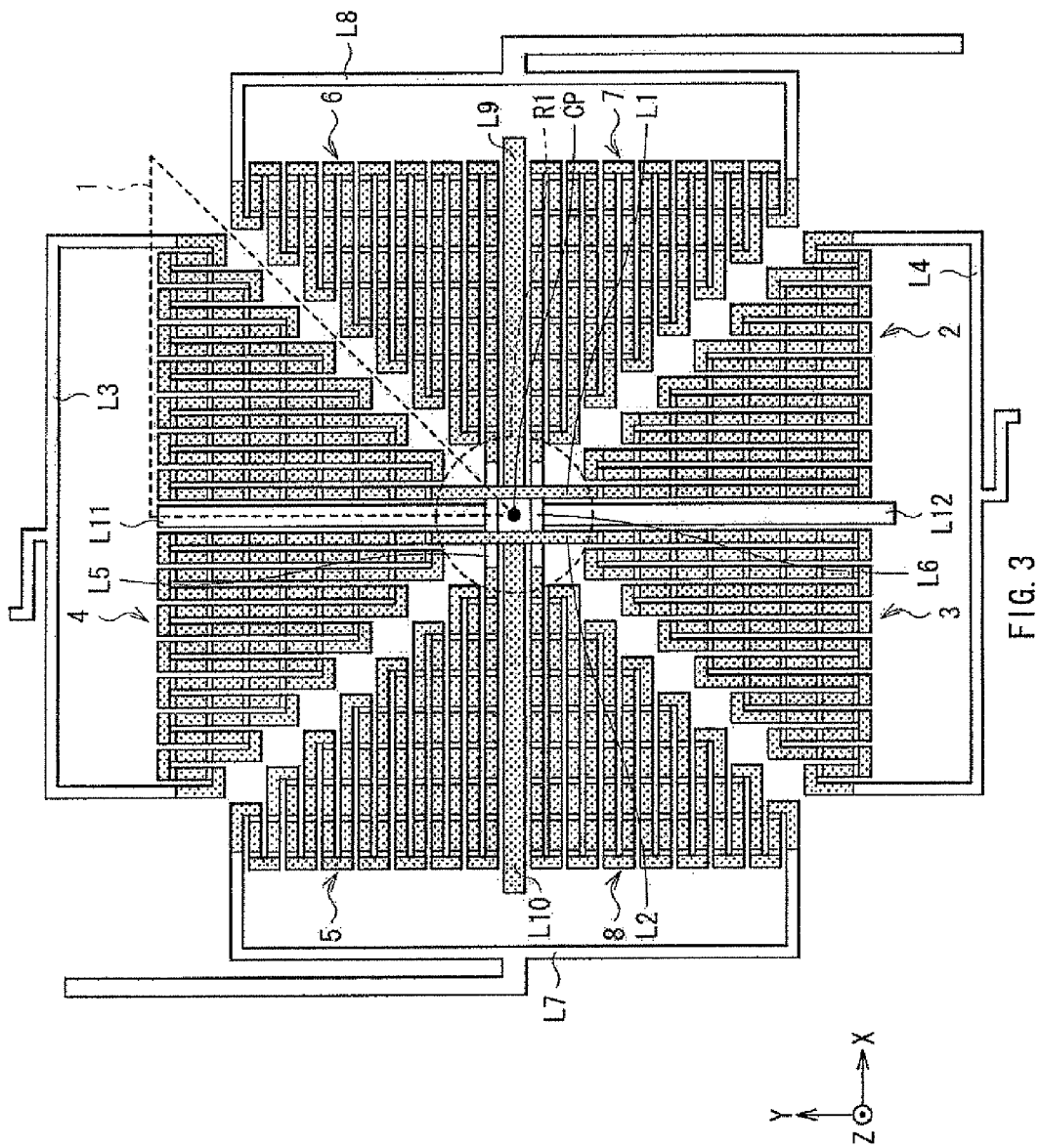
FIG. 3 is a plane view showing a detail of a key configuration of the magnetic sensor shown in FIG. 1.

Firstly, the configuration of a magnetic sensor as a first embodiment of the invention will be described with reference to FIG. 1 to FIG. 3. FIG. 1 is a schematic view showing the entire configuration of the magnetic sensor of this embodiment, FIG. 2 is a circuit diagram showing the circuit configuration in the magnetic sensor, and FIG. 3 is a plane view showing a detailed configuration of key components in the magnetic sensor.

As shown in FIG. 1, the magnetic sensor has first to eighth magneto-resistive (MR) elements 1 to 8, terminals T1 to T8, connecting portions L1 to L8 (partly omitted in FIG. 1), difference detectors AMP1 and AMP2, and an angle calculating circuit 50 (omitted in FIG. 1) on a substrate 10. The first to eighth MR elements 1 to 8 are evenly arranged so as to surround a central region R1 and make a circle in a peripheral region. Among the MR elements, the first to fourth MR elements 1 to 4 form a first bridge circuit 11 (FIG. 2), and the fifth to eighth MR elements 5 to 8 form a second bridge circuit 12 (FIG. 2). For example, the terminals T1, T2 and terminals T5, T6 are connected to input side terminals of the difference detectors AMP1 and AMP2 (FIG. 2) respectively, which form a difference detecting section. The terminals T3 and T7 are connected to power sources Vcc1 and Vcc2 (FIG. 2), respectively. The terminals T4 and T8 are both grounded.

The magnetic sensor detects, for example, a rotational angle $\theta$ (described later) of a signal magnetic field Hm that rotates on a rotational plane (i.e. XY plane in this embodiment) in parallel to the substrate 10. As shown in FIG. 1, the signal magnetic field Hm is formed by a pair of magnetic poles HM1 and HM2 that are arranged face to face with the magnetic sensor therebetween. The pair of the magnetic poles HM1 and HM2 rotates around a central point CP positioned at the center of the magnetic sensor on the XY plane while maintaining the positional relationship so that the signal magnetic field Hm rotates.

The circuit configuration of the magnetic sensor in this embodiment will be described with reference to FIG. 2.

The magnetic sensor includes the first bridge circuit 11, the second bridge circuit 12, the difference detectors AMP1 and AMP2, and the angle calculating circuit 50. In the first bridge circuit 11, one end of the first MR element 1 and one end of the second MR element 2 are connected to each other at a connecting point P1, and one end of the third MR element 3 and one end of the fourth MR element 4 are connected to each other at a connecting point P2. The other end of the first MR element 1 is connected to the other end of the fourth MR element 4 at a connecting point P3, and the other end of the second MR element 2 is connected to the other end of the third MR element 3 at a connecting point P4. Herein, the connecting point P3 is connected to the power source Vcc1 through the terminal T3 (FIG. 1), and the connecting point P4 is grounded through the terminal T4 (FIG. 1). The connecting points P1 and P2 are connected to the input side terminals of the difference detector AMP1 through the lead lines L9 and L10, the terminals T1 and T2 (FIG. 1), and the like, respectively. The difference detector AMP1 detects a potential difference between the connecting point P1 and the connecting point P2 (difference between voltage drops generated at the first and fourth MR elements 1 and 4) when a voltage is applied between the connecting point P3 and the connecting point P4, and outputs the potential difference as a differential signal S1 toward the angle calculating circuit 50. Note that the arrow designated by reference numeral J31 in FIG. 1 and FIG. 2 schematically indicates the direction of the magnetization of a magnetization pinned layer 31 (described later) in each of the first to fourth MR elements 1 to 4. In other words, it indicates that each resistance value of the first and third MR elements 1 and 3 changes in the same direction (i.e., in the same increasing/decreasing direction) depending on a change of the external signal magnetic field Hm, and each resistance value of the second and fourth MR elements 2 and 4 changes in a direction (i.e., in an increasing/decreasing direction) opposite to that of the first and third MR elements 1 and 3 depending on the change of the signal magnetic field. For example, when the signal magnetic field Hm rotates, each resistance value in the first and third MR elements 1 and 3 increases, whereas each resistance value in the second and fourth MR elements 2 and 4 decreases.

On the other hand, in the second bridge circuit 12, one end of the fifth MR element 5 and one end of the sixth MR element 6 are connected to each other at a connecting point P5, and one end of the seventh MR element 7 and one end of the eighth MR element 8 are connected to each other at a connecting point P6. The other end of the fifth MR element 5 is connected to the other end of the eighth MR element 8 at a connecting point P7, and the other end of the sixth MR element 6 is connected to the other end of the seventh MR element 7 at a connecting point P8. Herein, the connecting point P7 is connected to the power source Vcc2 through the terminal T7 (FIG. 1), and the connecting point P8 is grounded through the terminal T8 (FIG. 1). The connecting points P5 and P6 are connected to the input side terminals of the difference detector AMP2 through the lead lines L11 and L12, the terminals T5 and T6 (FIG. 1), and the like, respectively. The difference detector AMP2 detects a potential difference between the connecting points P5 and P6 (a difference between voltage drops occurred in the fifth MR element 5 and the eight MR element 8) when a voltage is applied between the connecting points P7 and P8, and outputs the potential difference as a differential signal S2 toward the angle calculating circuit 50. For the second bridge circuit 12, the arrow designated by reference numeral 331 schematically indicates the direction of the magnetization of the magnetization pinned layer 31 in each of the fifth to eighth MR elements 5 to 8. In other words, each resistance value of the fifth and seventh MR elements 5 and 7 changes in the same direction (i.e., in the same increasing/decreasing direction) depending on the change of the external signal magnetic field Hm, and each resistance value of the sixth and eighth MR elements 6 and 8 changes in a direction (i.e., in an increasing/decreasing direction) opposite to that of the fifth and seventh MR elements 5 and 7 depending on the change of the signal magnetic field. For example, when the signal magnetic field Hm rotates, each resistance value of the fifth and seventh MR elements increases, whereas each resistance value of the sixth and eighth MR elements decreases. Furthermore, since the magnetization J31 in the fifth to eighth MR elements 5 to 8 is in a direction orthogonal to the magnetization J31 in the first to fourth MR elements 1 to 4, the magnetic sensor exhibits good detection property over all directions(360°) as a whole.

The substrate 10 has a rectangular shape to support the entire magnetic sensor and is formed by ceramics such as glass, silicon (Si), aluminum oxide ($Al_2O_3$), or AlTic ($Al_2O_3$-Tic). Note that an insulation layer (not shown) including ceramics such as silicon oxide ($SiO_2$) or $Al_2O_3$ may be provided so as to cover the substrate 10.

The first to eighth MR elements 1 to 8 are positioned at the same distance from the central point CP of the central region R1. When viewed from the upper side, each MR element extends in a zigzag shape as a whole (see FIG. 3). The first to eighth MR elements 1 to 8 have a substantially same structure excepting the direction of the magnetization J31 of the magnetization pinned layer 31. In other words, the fifth, third, and seventh MR elements 5, 3, and 7 all have a structure rotationally symmetrical to the first MR element 1 around the central point CP of the central region R1. The fourth, eighth, second, and sixth MR elements 4, 8, 2, and 6 all have an axisymmetric structure with the first MR element 1. More specifically, the first and third MR elements 1 and 3 are diagonally positioned from each other with the central point CP of the central region R1 sandwiched therebetween, the second and fourth MR elements 2 and 4 are diagonally positioned from each other with the central point CP sandwiched therebetween, the fifth and seventh MR elements 5 and 7 are diagonally positioned from each other with the central point CP sandwiched therebetween, and the sixth and eighth MR elements 6 and 8 are diagonally positioned from each other with the central point CP sandwiched therebetween. That is, the first and third MR elements 1 and 3 are diagonally positioned with reference to the central point CP of the central region R1, the second and fourth MR elements 2 and 4 are diagonally positioned with reference to the central point CP. The fifth and seventh MR elements 5 and 7 are diagonally positioned with reference to the central point CP, and the sixth and eighth MR elements 6 and 8 are diagonally positioned with reference to the central point CP.

As shown in FIG. 3, one end of the first MR element 1 and one end of the second MR element 2 are connected to each other through the first connecting portion L1 that is extending to the central region R1 positioned therebetween. Similarly, one end of the third MR element 3 and one end of the fourth MR element 4 are connected to each other through the second connecting portion L2 that is extending to the central region R1. The first connecting portion L1 and the second connecting portion L2 are provided on the same level as, for example, an upper electrode 41 (described later), and extend (in Y axis direction) in parallel to each other without crossing. In addition, the other end of the first MR element 1 is connected to the other end of the fourth MR element 4 through the third connecting portion L3, and the other end of the second MR element 2 is connected to the other end of the third MR element 3 through the fourth connecting portion L4. Moreover, the first connecting portion L1 is connected to one end of the first lead line L9 extending in the X direction so as to be orthogonal thereto, and the second connecting portion L2 is connected to one end of the second lead line L10 extending in the X direction so as to be orthogonal thereto. More specifically, the first lead line L9 extends between the sixth MR element 6 and the seventh MR element 7 so as to apart from the central region R1 starting from the first connecting portion L1. The second lead line L10 extends between the fifth MR element 5 and the eighth MR element 8 so as to apart from the central region R1 starting from the second connecting portion L2. The first and second lead lines L9 and L10 are respectively connected to the input side terminals of the difference detector AMP1 as described above.

On the other hand, one end of the fifth MR element 5 and one end of the sixth MR element 6 are connected to each other through the fifth connecting portion L5 extending to the central region R1. Similarly, one end of the seventh MR element 7 and one end of the eighth MR element 8 are connected to each other through the sixth connecting portion L6 extending to the central region R1. The fifth connecting portion L5 and the sixth connecting portion L6 extend (in the X axis direction) in parallel to each other and three-dimensionally cross the first connecting portion L1 and the second connecting portion L2. In other words, the fifth connecting portion L5 and the sixth connecting portion L6 are provided on the same level as a lower electrode 42 (described later), and cross the first connecting portion L1 and the second connecting portion L2 that are positioned on the same level as the upper electrode 41 with a distance in a thickness direction (in the Z axis direction). It is preferable that the fifth connecting portion L5 and the sixth connecting portion L6 extend so as to be orthogonal to the first connecting portion L1 and the second connecting portion L2. The other end of the fifth MR element 5 is connected to the other end of the eighth MR element 8 through the seventh connecting portion L7, and the other end of the sixth MR element 6 is connected to the other end of the seventh MR element 7 through the eighth connecting portion L8. Moreover, the fifth connecting portion L5 is connected to one end of the third lead line L11 extending in the Y axis direction so as to be orthogonal thereto, and the sixth connecting portion L6 is connected to one end of the fourth lead line L12 extending in the Y axis direction so as to be orthogonal thereto. More specifically, the third lead line L11 extends between the first MR element 1 and the fourth MR element 4 so as to apart from the central region R1 starting from the fifth connecting portion L5. The fourth lead line L12 extends between the second MR element 2 and the third MR element 3 so as to apart from the central region R1 starting from the sixth connecting portion L6. The third and fourth lead lines L11 and L12 are respectively connected to the input side terminals of the difference detector AMP2 as described above. All of the first to eighth connecting portions L1 to L8 and the first to fourth lead lines L9 to L12 are formed by non-magnetic high-conductive material such as copper.

Figure 4:
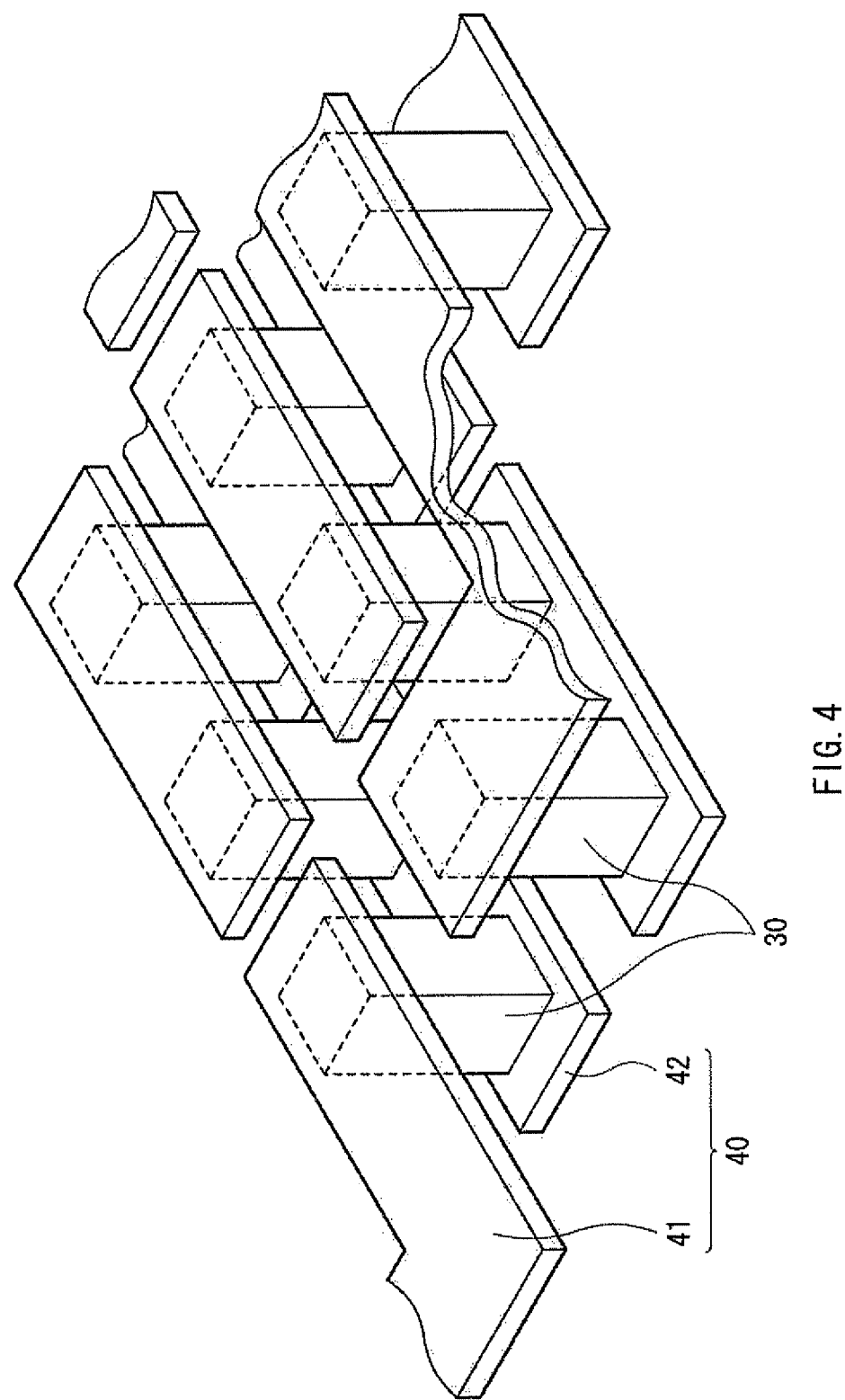
FIG. 4 is a perspective view showing in enlarged dimension the configuration of the first to eighth MR elements shown in FIG. 1.

FIG. 4 is a perspective view showing in enlarged dimension a part of the first to eighth MR elements 1 to 8. Each of the first to eighth MR elements 1 to 8 has a plurality of magneto-resistive (MR) films 30 arranged on the substrate 10, and conductors 40 that connects the MR films 30 in series. The conductor 40 sandwiches each MR film 30 in the stacked layer direction (in the Z axis direction), and is formed with the upper electrode 41 and the lower electrode 42 that are arranged face to face so as to contact with the upper surface and the bottom surface of each MR film 30. The upper electrode 41 and the lower electrode 42 extend along an arrangement direction of the adjacent MR films 30. In other words, all of the MR films 30 are alternately connected by the upper electrode 41 and the lower electrode 42, and are connected in series as a whole. Both the upper electrode 41 and the lower electrode 42 are formed by a non-magnetic high-conductive material such as copper.

Figure 5:
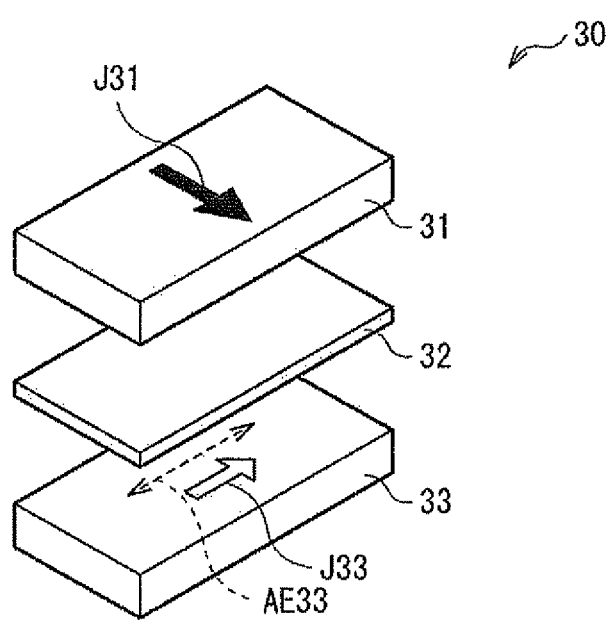
FIG. 5 is a perspective view showing a stacked layer structure of a MR film included in the first to eighth MR elements shown in FIG. 1.

As shown in FIG. 5, each MR film 30 has a spin-valve structure in which a plurality of functional films including magnetic layers are stacked. In particular, a magnetization pinned layer 31 having magnetizations J31 that are pinned in a certain direction, an intermediate layer 32 that does not express a specific magnetization direction, and a magnetization free layer 33 having the magnetizations J33 that change depending on the signal magnetic field Hm are stacked in order. Note that FIG. 5 is a diagram showing non-load state in which the signal magnetic field Hm is not applied. In this case, the magnetizations J33 of the magnetization free layer 33 are in parallel to the magnetization easy axis AE33 thereof, and are orthogonal to the magnetizations J31 of the magnetization pinned layer 31. Each of the magnetization pinned layer 31 in the first and third MR elements 1 and 3 has the magnetizations J31 that are pinned in +Y direction, for example, and each of the magnetization pinned layer 31 in the second and fourth MR elements 2 and 4 has the magnetizations J31 that are pinned in −Y direction. Each of the magnetization pinned layer 31 in the fifth and seventh MR elements 5 and 7 has the magnetizations J31 that are orthogonal to the magnetizations J31 in the first to fourth MR elements 1 to 4 and are pinned in −X direction. Each of the magnetization pinned layer 31 in the sixth and eighth MR elements 6 and 8 has the magnetizations J31 that are pinned in +X direction, Note that the magnetization pinned layer 31, the intermediate layer 32 and the magnetization free layer 33 may have a single layer structure or a multilayer structure formed by a plurality of layers.

The magnetization pinned layer 31 is formed of a ferromagnetic material such as cobalt (Co), cobalt iron alloy (CoFe), and cobalt iron boron alloy (CoFeB). Note that an antiferromagnetic layer (not shown) may be provided on a side opposite to the intermediate layer 32 so as to be adjacent to the magnetization pinned layer 31. Such an antiferromagnetic layer is formed of an antiferromagnetic material such as platinum manganese alloy (PtMn) and iridium manganese alloy (IrMn). The antiferromagnetic layer of the first MR element 1, for example, is in a state where a spin magnetic moment in the +Y direction and a spin magnetic moment in the −Y direction are completely canceled with each other, and acts to fix the direction of the magnetizations J31 of the adjacent magnetization pinned layers 31 in +Y direction.

The intermediate layer 32 is a non-magnetic tunnel barrier layer formed of, for example, magnesium oxide (MgO), and is thin in a degree where a tunnel current based on quantum mechanics can pass through. The tunnel barrier layer formed of MgO can be obtained by, for example, oxidization treatment of thin film formed of magnesium (Mg) or reactive sputtering processing in which magnesium is sputtered in the oxygen atmosphere in addition to sputtering processing using a target formed of MgO, The intermediate layer 32 may be formed using oxide or nitride of aluminum (Al), tantalum (Ta) and hafnium (Hf) in addition to MgO.

The magnetization free layer 33 is a soft ferromagnetic layer, and has a magnetization easy axis AE33 in the X axis direction, for example. The magnetization free layer 33 is formed of, for example, cobalt iron alloy (CoFe), nickel iron alloy (NiFe) or cobalt iron boron (CoFeB).

With such a configuration, in the first bridge circuit 11, when a reading current is supplied from the power source Vcc1 through the terminal T3, for example, the reading current flows into the first and fourth MR elements 1 and 4 through the third connecting portion L3 (connecting point P3). In the first and fourth MR elements 1 and 4, the reading current respectively flows into the upper electrode 41, the MR film 30, the lower electrode 42, the MR film 30, and the upper electrode 41 in this order. After passing through all the MR films 30, the reading current reaches the first connecting portion L1 (connecting point P1) or the second connecting portion L2 (connecting point P2). Thereafter, the reading current flows into one end of the second MR element 2 and one end of the third MR element 3 from the first and second connecting portions L1 and L2, respectively. Furthermore, the reading current passes through the second and third MR elements 2 and 3, and then reaches the ground GND through the fourth connecting portion L4 (connecting point P4) and the terminal T4.

On the other hand, in the second bridge circuit 12, when the reading current is supplied from the power source Vcc2 through the terminal T7, for example, the reading current flows into the fifth and eighth MR elements 5 and 8 through the seventh connecting portion L7 (connecting point P7). After passing through each of the MR films 30 in the fifth and eighth MR elements 5 and 8, the reading current reaches the fifth connecting portion L5 (connecting point P5) or the sixth connecting portion L6 (connecting point P6). Thereafter, the reading current flows into one end of the sixth MR element 6 and one end of the seventh MR element 7 from the fifth and sixth connecting portions L5 and L6, respectively. Moreover, the reading current reaches the ground GND through the eighth connecting portion L8 (connecting point P8) and the terminal T8 after passing though the sixth and seventh MR elements 6 and 7.

Using the magnetic sensor, the method of detecting a rotational angle θ of the signal magnetic field Hm based on the differential signals S1 and S2 obtained from the first and second bridge circuits 11 and 12 will be described below with reference to FIG. 2 mainly.

When a current I10 is applied from the power source Vcc1 in the first bridge circuit 11, the current I10 is divided into a current I1 and a current I2 at the connecting point P3. When the current I1 flows through the first and second MR elements 1 and 2, a signal e1 that is relating to a potential and is represented by the following equation (1) is obtained at the connecting point P1.

$$e1 = I1 \times R(\theta 1) - I1 \times R(\theta 2) \quad (1)$$
$$= I1 \times \{R(\theta 1) - R(\theta 2)\}$$

where,
- θ1 is an angle formed by the direction of the signal magnetic field Hm and the magnetization J33 of the magnetization free layer 33 in the first MR element 1;
- θ2 is an angle formed by the direction of the signal magnetic field Hm and the magnetization J33 of the magnetization free layer 33 in the second MR element 2;
- R(θ1) is a resistance value of the first MR element 1 at the angle θ1; and
- R(θ2) is a resistance value of the second MR element 2 at the angle 2θ.

On the other hand, when the current I2 flows through the third and fourth MR elements 3 and 4, a signal e2 that is relating to a potential and is represented by the following equation (2) is obtained at the connecting point P2.

$$e2 = I2 \times R(\theta 3) - I2 \times R(\theta 4) \quad (2)$$
$$= I2 \times \{R(\theta 3) - R(\theta 4)\}$$

where,
- θ3 is an angle formed by the direction of the signal magnetic field Hm and the magnetization J33 of the magnetization free layer 33 in the third MR element 3;
- θ4 is an angle formed by the direction of the signal magnetic field Hm and the magnetization J33 of the magnetization free layer 33 in the fourth MR element 4;
- R(θ3) is a resistance value of the third MR element 3 at the angle θ3; and
- R(θ4) is a resistance value of the fourth MR element 4 at the angle θ4.

Accordingly, the differential signal S1 is represented as the following equation (3) using the equations (1) and (2).

$$S1 = e1 - e2 \quad (3)$$
$$= I1 \times \{R(\theta 1) - R(\theta 2)\} - I2 \times \{R(\theta 3) - R(\theta 4)\}$$

Similarly, when a current I20 is applied from the power source Vcc2 in the second bridge circuit 12, the current I20 is divided into a current I3 and a current I4 at the connecting point P7. When the current I3 flows through the fifth and sixth MR elements 5 and 6, a signal e3 that is relating to a potential and is represented by the following equation (4) is obtained at the connecting point P5.

$$e3 = I3 \times R(\theta 5) - I3 \times R(\theta 6) \quad (4)$$
$$= I3 \times \{R(\theta 5) - R(\theta 6)\}$$

where,
- θ5 is an angle formed by the direction of the signal magnetic field Hm and the magnetization J33 of the magnetization free layer 33 in the fifth MR element 5;
- θ6 is an angle formed by the direction of the signal magnetic field Hm and the magnetization J33 of the magnetization free layer 33 in the sixth MR element 6;
- R(θ5) is a resistance value of the fifth MR element 5 at the angle θ5; and
- R(θ6) is a resistance value of the sixth MR element 6 at the angle θ6.

On the other hand, when the current I4 flows through the seventh and eighth MR elements 7 and 8, a signal e4 that is relating to a potential and is represented by the following equation (5) is obtained at the connecting point P6.

$$e4 = I4 \times R(\theta 7) - I4 \times R(\theta 8) \quad (5)$$
$$= I4 \times \{R(\theta 7) - R(\theta 8)\}$$

where,
- θ7 is an angle formed by the direction of the signal magnetic field Hm and the magnetization J33 of the magnetization free layer 33 in the seventh MR element 7;
- θ8 is an angle formed by the direction of the signal magnetic field Hm and the magnetization J33 of the magnetization free layer 33 in the eighth MR element 8;

R($\theta$7) is a resistance value of the seventh MR element 7 at the angle $\theta$7; and R($\theta$8) is a resistance value of the eighth MR element 8 at the angle$\theta$8.

Accordingly, the differential signal S2 is represented by the following equation (6) using the equations (4) and (5).

$$S2 = e3 - e4 \quad (6)$$
$$= I3 \times \{R(\theta 5) - R(\theta 6)\} - I4 \times \{R(\theta 7) - R(\theta 8)\}$$

The angle calculating circuit into which the differential signals S1 and S2 is input calculates a value E represented by the following equation (7) using the equations (3) and (6).

$$E = \frac{S1}{S2} \quad (7)$$
$$= \frac{[I1 \times \{R(\theta 1) - R(\theta 2)\} - I2 \times \{R(\theta 3) - R(\theta 4)\}]}{[I3 \times \{R(\theta 5) - R(\theta 6)\} - I4 \times \{R(\theta 7) - R(\theta 8)\}]}$$

Herein, the value E does not include a factor depending on a change in temperature, and is determined by only the currents I1 to I4 and the angles $\theta$1 to $\theta$8. In this embodiment, the directions of the magnetizations J31 of the magnetization pinned layers 31 in the first to eighth MR elements 1 to 8 are relatively fixed. Consequently, all the angles $\theta$2 to $\theta$8 can be represented using the angle $\theta$1. In particular, for example, the angles $\theta$2 to $\theta$4 can be represented by $\theta 2 = \theta 1 + \pi$, $\theta 3 = \theta 1$, and $\theta 4 = \theta 1 + \pi$, respectively. Similarly, the angles $\theta$5 to $\theta$8 can be represented by $\theta 5 = \theta 1 - (\pi/2)$, $\theta 6 = \theta 1 + (\pi/2)$, $\theta 7 = \theta 1 - (\pi/2)$, and $\theta 8 = \theta 1 + (\pi/2)$, respectively. Herein, by setting the currents I1 to I4 to an equivalent value and using the MR elements with the same specification as the first to eighth MR elements 1 to 8 (expressing the same change of the resistance value depending on the rotational angle $\theta$ of the signal magnetic field), the above equation (7) is represented by the following equation (8).

$$E = \frac{\{R(\theta 1) - R(\theta 1 + \pi) + R(\theta 1) - R(\theta 1 + \pi)\}}{\{R(\theta 1 - (\frac{\pi}{2})) - R(\theta 1 + (\frac{\pi}{2})) - R(\theta 1 - (\frac{\pi}{2})) - R(\theta 1 + (\frac{\pi}{2}))\}} \quad (8)$$
$$= R(\theta 1) / R(\theta 1 - (\frac{\pi}{2}))$$

Accordingly, the angle $\theta$1 is calculated from the value E based on the measurement value. As a result, the rotational angle $\theta$ of the signal magnetic field Hm rotated from a reference position can be determined.

As described above, according to this embodiment, the first and second connecting portions L1 and L2 three-dimensionally cross the fifth and sixth connecting portions L5 and L6 in the central region R1 that is positioned between each pair of the first to eighth MR elements 1 to 8, in an electrically insulated manner from each other. Consequently, the lengths of the first, second, fifth, and sixth connecting portions L1, L2, L5, and L6 in the in-plane direction can be shortened compared with the case where the first and second connecting portions L1 and L2 do not cross the fifth and sixth connecting portions L5 and L6. In particular, the first, second, fifth, and sixth connecting portions L1, L2, L5, and L6 are formed by only parts that extend in a linear fashion (i.e., configured of a single straight-line segment), the first and second connecting portions L1 and L2 are in parallel to each other, and the fifth and sixth connecting portions L5 and L6 extend in a direction orthogonal to the first and second connecting portions L1 and L2. Accordingly, the lengths of the first, second, fifth, and sixth connecting portions L1, L2, L5, and L6 in the in-plane direction can be further shortened. In addition, symmetric property can be improved around the central point CP relating to the resistance of the wirings including the first to eighth connecting portions L1 to L8 in the entire magnetic sensor. The symmetric property of third, fourth, seventh, and eighth connecting portions L3, L4, L7, and L8 in planar shape and the symmetric property of the first to fourth lead lines L9 to L12 in planar shape also contribute to the improvement of the symmetric property relating to the wiring resistance. For these reasons, the resistance can be decreased by reducing the area occupied by the first to eighth connecting portions L1 to L8, and variations of the mutual resistance can be decreased. Accordingly, the magnetic sensor can be downsized in the entire configuration while maintaining good detection property of the rotational angle $\theta$ of the signal magnetic field Hm and good reliability of the detecting operation.

Also, in this embodiment, the first to eighth MR elements 1 to 8 are arranged at the same distance from the central point CP of the central region R1 so that the external signal magnetic field Hm affects the first to eighth MR elements 1 to 8 more equally. In addition, a pair of MR elements expressing a resistance change in the same direction (i.e., in the same increasing/decreasing direction) from each other in response to the change of the signal magnetic field Hm is arranged so as to sandwich the central point CP. Accordingly, the magnetically symmetric property with respect to the change of the signal magnetic field Hm can be improved.

Furthermore, in the first to eighth MR elements 1 to 8 of this embodiment, the upper electrodes 41 and the lower electrodes 42 are arranged face to face so as to contact with the upper surface and the bottom surface of each of the MR films 30 arranged on the substrate 10, and the MR films 30 are connected in series. By connecting the MR films 30 in series, the amount of the resistance change of each MR film 30 when the signal magnetic field Hm changes are added, and the total amount of the resistance change can be increased. In addition, since the upper electrode 41 and the lower electrode 42 are provided on the different levels from each other with each MR film 30 therebetween, the induction magnetic field generated by the reading current that flows through the upper electrode 41 and the induction magnetic field generated by the reading current that flows through the lower electrode 42 are canceled with each other. Furthermore, since a portion where the upper electrode and the lower electrode 42 extend along the arrangement direction of the adjacent MR films 30 (in the same direction) is provided, the induction magnetic field can be more effectively canceled.

[Second Embodiment]

Figure 6:
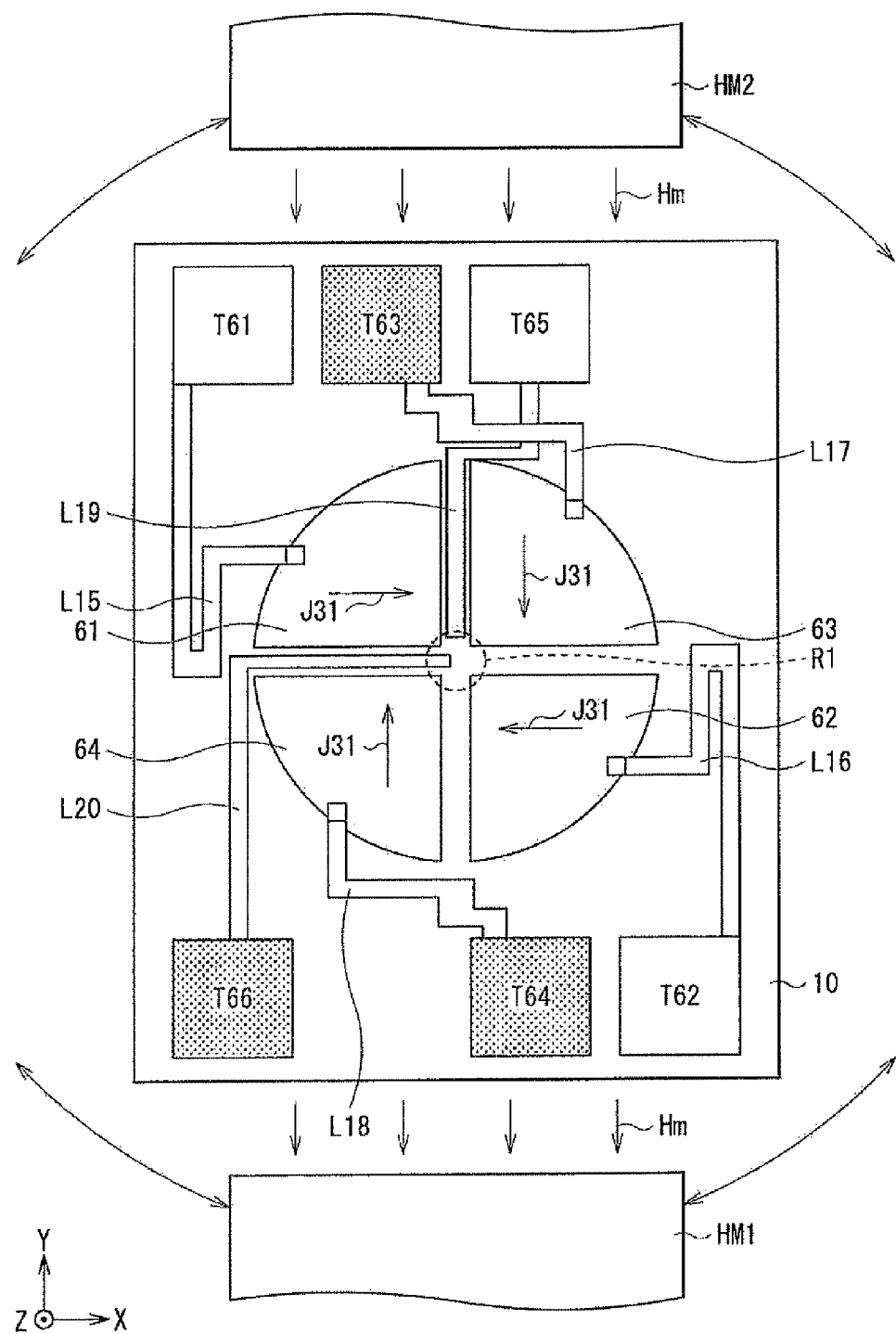
FIG. 6 is a schematic view showing an entire configuration of a magnetic sensor as a second embodiment of the invention.
Figure 7:
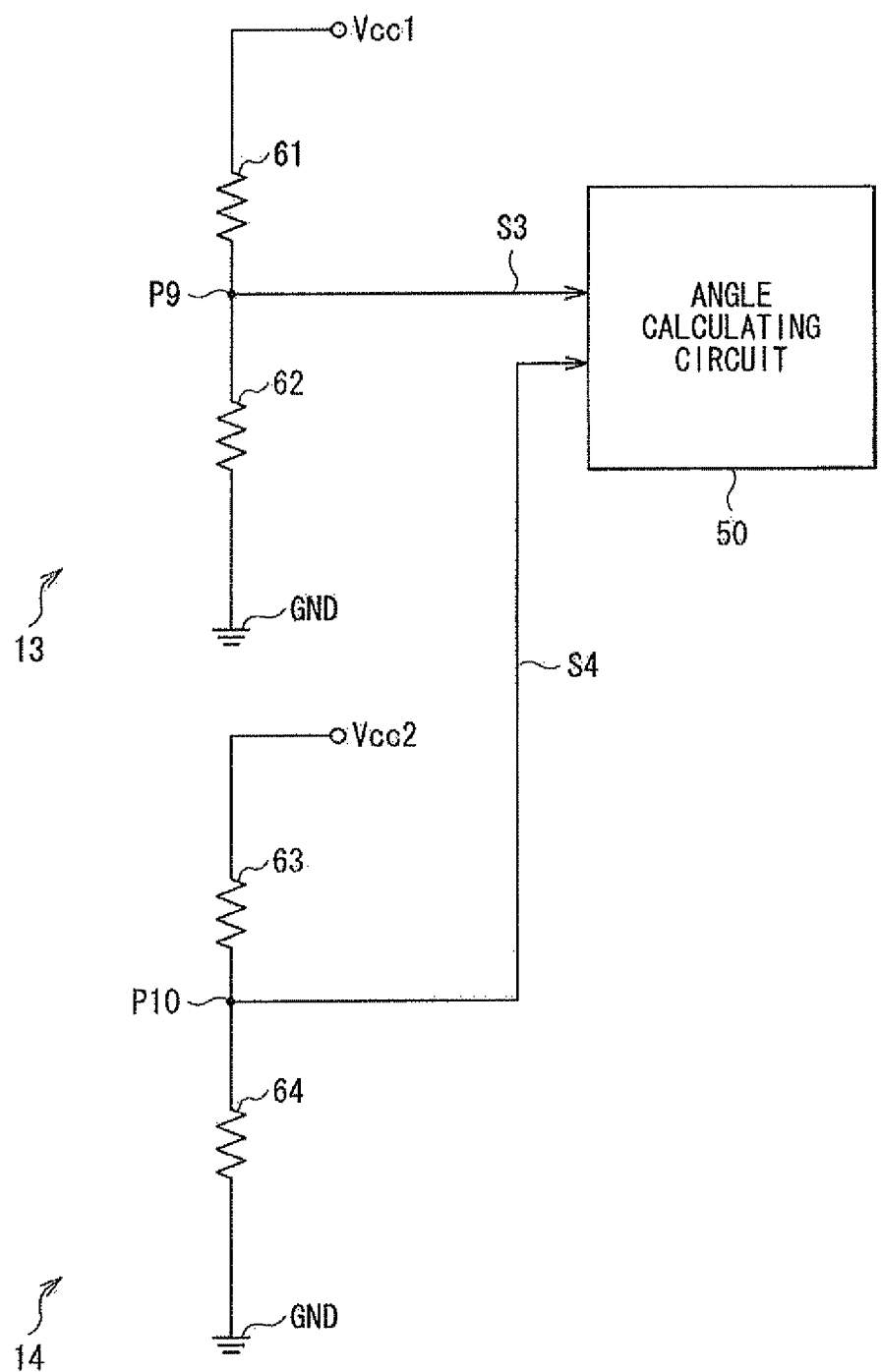
FIG. 7 is a circuit diagram showing a circuit configuration of the magnetic sensor shown in FIG. 6.
Figure 8:
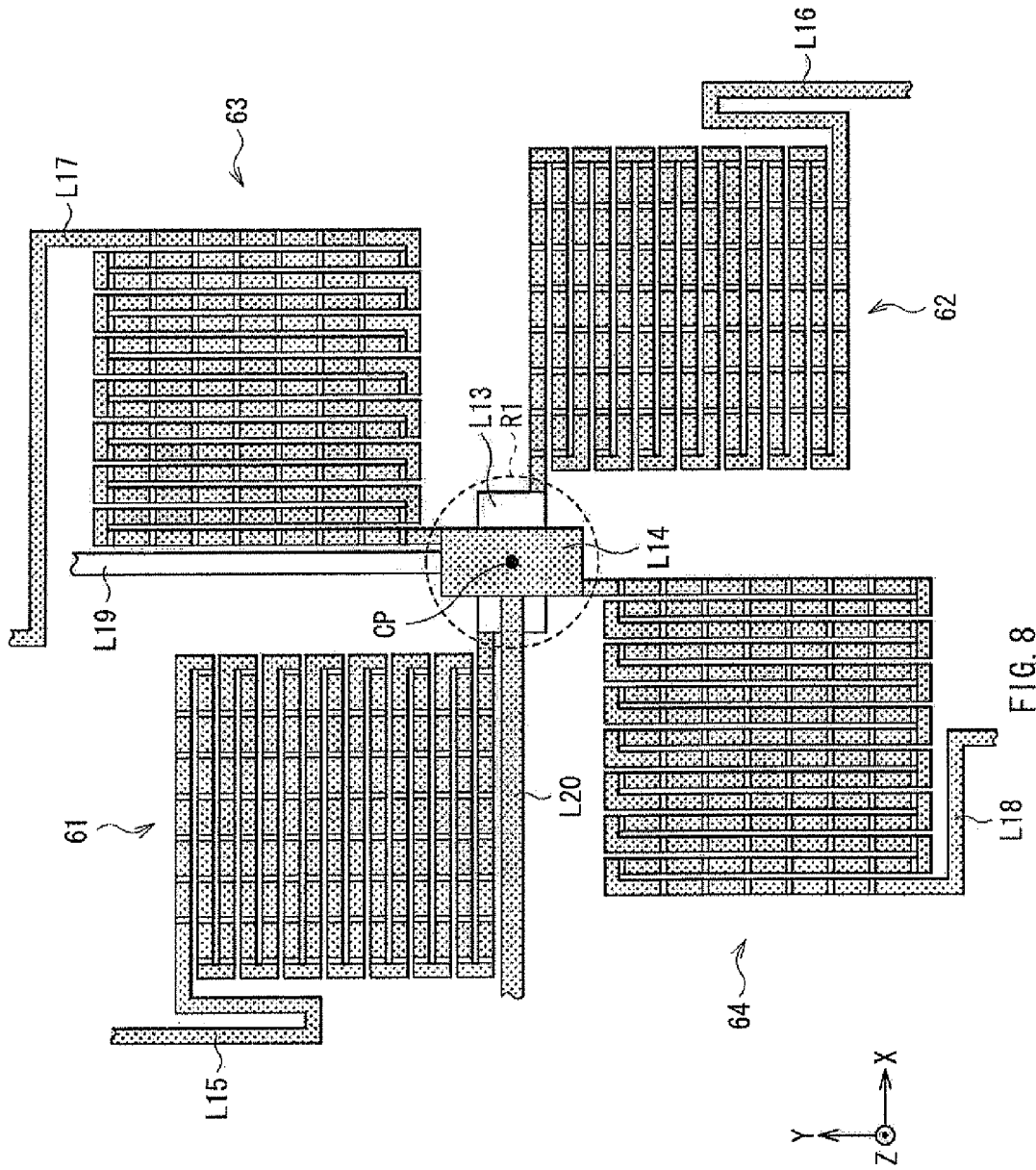
FIG. 8 is a plane view showing a detail of a key configuration of the magnetic sensor shown in FIG. 7.

The configuration of a magnetic sensor as a second embodiment of the invention will be described with reference to FIG. 6 to FIG. 8. FIG. 6 is a schematic view showing the entire configuration of the magnetic sensor of this embodiment, FIG. 7 is a circuit diagram showing the circuit configuration of the magnetic sensor, and FIG. 8 is a plane view showing a detailed configuration of key components in the magnetic sensor.

The magnetic sensor of this embodiment has two half-bridge circuits including a pair of MR elements that are connected in series between a power source and the ground. For other points, the magnetic sensor of this embodiment has a substantially same configuration as the magnetic sensor of the first embodiment. Note that, in this embodiment, the components that are substantially the same as those of the first embodiment are denoted by the same reference numerals, and the description thereof will be appropriately omitted.

As shown in FIG. 6, the magnetic sensor has first to fourth MR elements 61 to 64, terminals T61 to T66, first to sixth connecting portions L13 to L18, lead lines L19 and L20 (partly omitted in FIG. 6), and an angle calculating circuit 50 (omitted in FIG. 6) on a substrate 10. The first to fourth MR elements 61 to 64 are evenly arranged so as to surround a central region R1 and make a circle in a peripheral region. Among the MR elements, the first and second MR elements 61 and 62 form a first half-bridge circuit 13 (FIG. 7), and the third and fourth MR elements 63 and 64 form a second half-bridge circuit 14 (FIG. 7).

In the first half-bridge circuit 13, one end of the first MR element 61 and one end of the second MR element 62 are connected to each other at a connecting point P9 (first connecting portion L13), the other end of the first MR element 61 (the other end opposite to the connecting point P9) is connected to a power source Vcc1 through the third connecting portion L15 and the terminal T61 (see FIG. 6), and the other end of the second MR element 62 (the other end opposite to the connecting point P9) is grounded through the fourth connecting portion L16 and the terminal T62 (see FIG. 6). The connecting portion P9 is connected to the angle calculating circuit 50 through the first lead line L19 and the terminal T65 (see FIG. 6). The directions of magnetizations J31 of a magnetization pinned layer 31 in the first and second MR elements 61 and 62 are in the direction opposite to each other (in X axis direction). Accordingly, each resistance value of the first and second MR elements 61 and 62 changes in the direction opposite to each other depending on a change of an external signal magnetic field Hm. For example, when the signal magnetic field Hm rotates, the resistance value of the first MR element 61 increases, whereas the resistance value of the second MR element 62 decreases.

On the other hand, in the second half-bridge circuit 14, one end of the third MR element 63 and one end of the fourth MR element 64 are connected to each other at a connecting point P10 (second connecting portion L14), the other end of the third MR element 63 is connected to a power source Vcc2 through the fifth connecting portion L17 and the terminal T63, and the other end of the fourth MR element 64 is grounded through the sixth connecting portion L18 and the terminal T64. The connecting point P10 is connected to the angle calculating circuit 50 through the lead line L20, the terminal T66 (see FIG. 6), and the like. The directions of the magnetizations J31 of the magnetization pinned layers 31 in the third and fourth MR elements 63 and 64 are in the direction opposite to each other (in Y axis direction). Accordingly, each resistance value of the third and fourth MR elements 63 and 64 changes in the direction opposite to each other depending on the change of the external signal magnetic field Hm. For example, when the signal magnetic field Hm rotates, the resistance value in the third MR element 63 increases, whereas the resistance value in the fourth MR element 64 decreases. Furthermore, since the magnetizations J31 in the third and fourth MR elements 63 and 64 are in a direction orthogonal to the magnetizations J31 in the first and second MR elements 61 and 62, the magnetic sensor exhibits good detection property over all directions)(360°) as a whole.

In the magnetic sensor having such a configuration, the reading current is applied from the power source Vcc1 to the first and second MR elements 61 and 62, and then a signal S3 relating to a potential is obtained from the connecting point P9. Similarly, the reading current is applied from the power source Vcc2 to the third and fourth MR elements 63 and 64, and then a signal S4 relating to a potential is obtained from the connecting point P10. In the angle calculating circuit 50, the rotational angle θ of the signal magnetic field Hm rotated from a reference position can be obtained based on the signals S3 and S4.

As described above, similarly to the first embodiment, the magnetic sensor of this embodiment can be downsized in the entire configuration while maintaining good detection property of the rotational angle θ of the signal magnetic field Hm and good reliability of the detecting operation.

[Third Embodiment]

Figure 9:
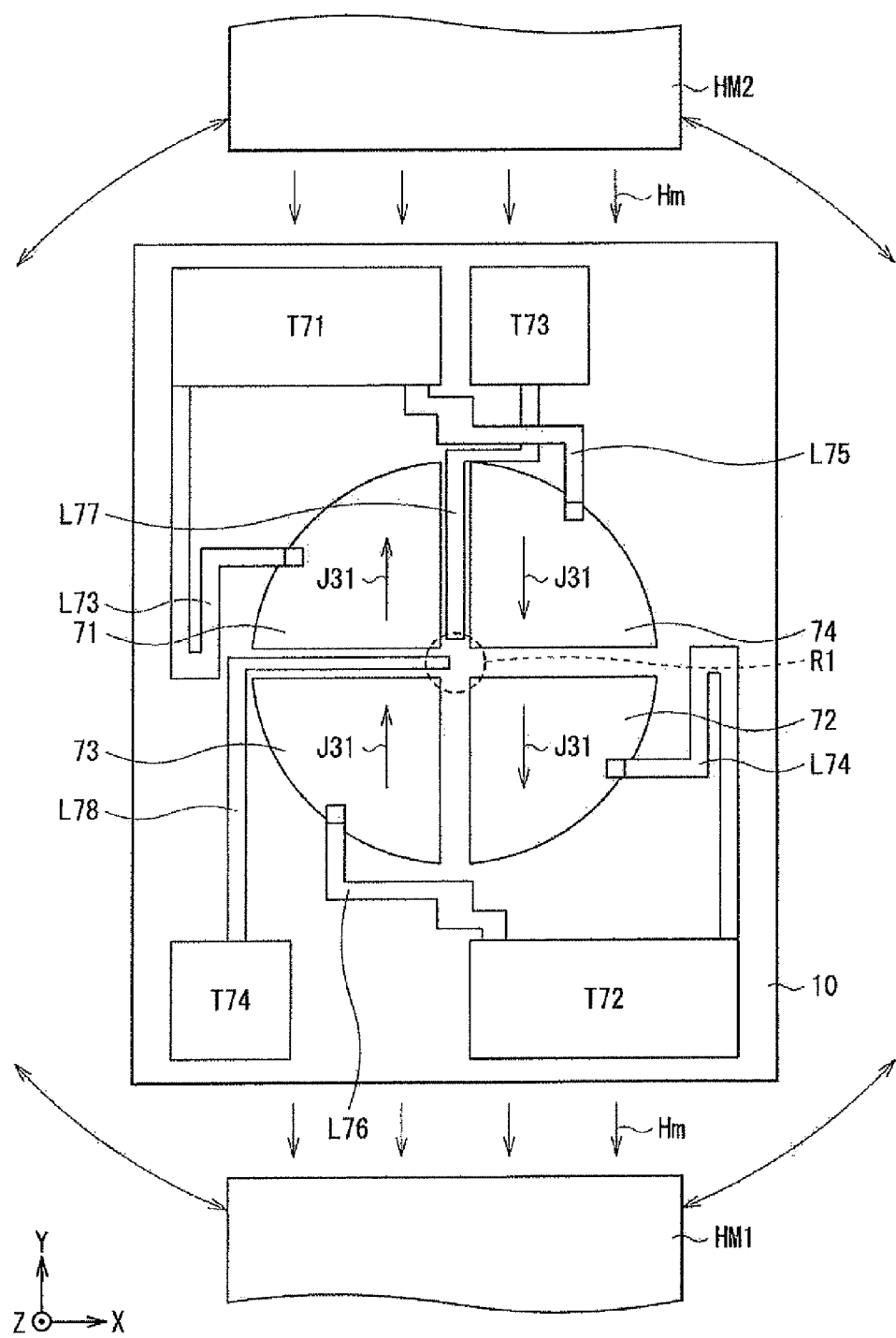
FIG. 9 schematically illustrates an entire configuration of a magnetic sensor according to a third embodiment of the invention.
Figure 10:
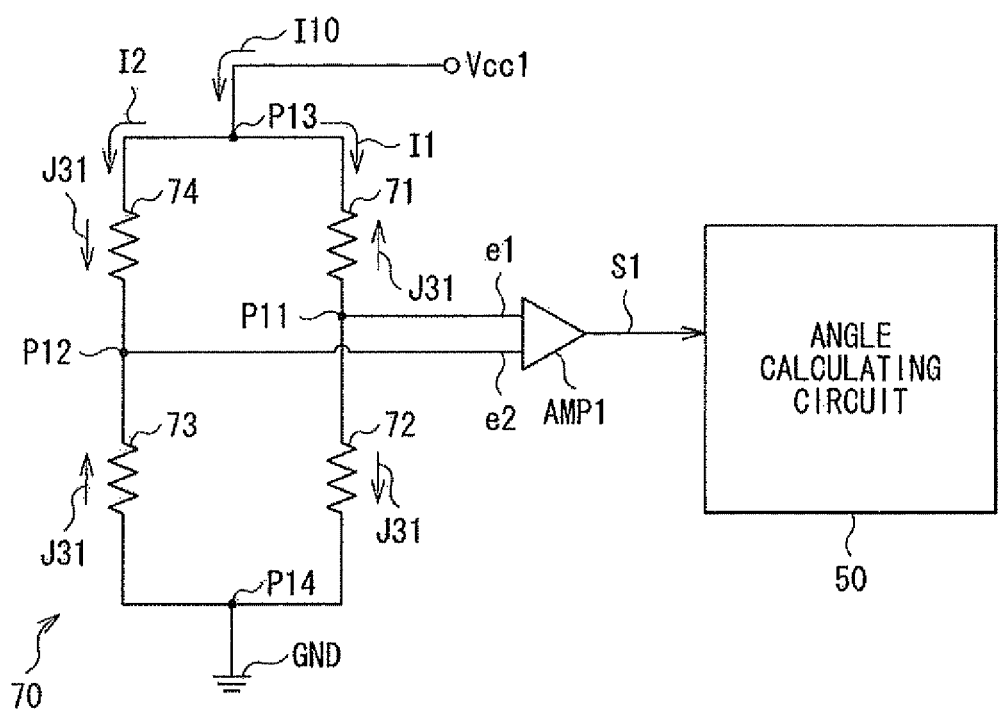
FIG. 10 is a circuit diagram illustrating a circuit configuration of the magnetic sensor illustrated in FIG. 9.

Now, a configuration of a magnetic sensor according to a third embodiment of the invention will be described with reference to FIGS. 9 to 11. FIG. 9 schematically illustrates the entire configuration of the magnetic sensor according to the third embodiment. FIG. 10 illustrates a circuit configuration of the magnetic sensor illustrated in FIG. 9. FIG. 11 is a plane view illustrating a key configuration of the magnetic sensor illustrated in FIG. 10 in detail.

In the first and the second embodiments, two full-bridge circuits (the first bridge circuit 11 and the second bridge circuit 12) or two half-bridge circuits (the first half-bridge circuit 13 and the second half-bridge circuit 14) are used to obtain the rotational angle θ of the signal magnetic field Hm over all directions (from zero degrees to 360 degrees both inclusive). However, the magnetic sensor according to the third embodiment illustrated in FIGS. 9 to 11 may be used when the rotational angle θ is limited to a range between zero degrees and 180 degrees both inclusive.

Referring to FIG. 9, the magnetic sensor includes first to fourth MR elements 71 to 74, terminals T71 to T74, first to six connecting lines L71 to L76, lead lines L77 and L78, and the angle calculating circuit 50 (omitted in FIG. 9), etc., which are provided on the substrate 10. The first to the fourth MR elements 71 to 74 are evenly arranged so as to surround the central region R1 and make a circle in a peripheral region thereof. The first to the fourth MR elements 71 to 74 form a bridge circuit 70 (see FIG. 10).

In the bridge circuit 70, one end of the first MR element 71 and one end of the second MR element 72 are connected to each other at a connecting point P11 (the first connecting line L71), and one end of the third MR element 73 and one end of the fourth MR element 74 are connected to each other at a connecting point P12 (the second connecting line L72). The first connecting line L71 and the second connecting line L72 are each provided in the central region R1. Further, the other end of the first MR element 71 and the other end of the fourth MR element 74 are connected to each other at a connecting point P13 (the terminal T71) through the third connecting line L73 and the fifth connecting line L75, and the other end of the second MR element 72 and the other end of the third MR element 73 are connected to each other at a connecting point P14 (the terminal T72) through the fourth connecting line L74 and the sixth connecting line L76.

The first connecting line L71 is connected to one end of the first lead line L77 extending in the Y direction so as to be orthogonal thereto, and the second connecting line L72 is connected to one end of the second lead line L78 extending in the Y direction so as to be orthogonal thereto. More specifically, the first lead line L77 extends between the first MR element 71 and the fourth MR element 74 so as to apart from the central region R1 starting from the first connecting line L71, and is connected to the terminal T73 (see FIG. 9). The second lead line L78 extends between the first MR element 71 and the third MR element 73 so as to apart from the central region R1 starting from the second connecting line L72, and is connected to the terminal T74 (see FIG. 9). The first lead line L77 and the second lead line L78 are respectively connected to the input side terminals of the difference detector AMP1 through the terminal T73 and the terminal T74. The other end of each of the first MR element 71 and the fourth MR element 74 is connected to the power source vcc1 through the connecting point P13 (the terminal T71), and the other end of each of the second MR element 72 and the third MR element 73 is grounded through the connecting point P14 (terminal T72).

The magnetization J31 of the magnetization pinned layer 31 in each of the first MR element 71 and the third MR element 73 is mutually in the same direction (in a plus Y direction). Thus, each resistance value of the first MR element 71 and the third MR element 73 changes in the same increasing/decreasing direction mutually in response the change in the external signal magnetic field Hm. Likewise, the magnetization J31 of the magnetization pinned layer 31 in each of the second MR element 72 and the fourth MR element 74 is mutually in the same direction (in a minus Y direction), Thus, each resistance value of the second MR element 72 and the fourth MR element 74 changes in the same increasing/decreasing direction mutually in response the change in the external signal magnetic field Hm. Consequently, a behavior is exhibited where, when the signal magnetic field Hm rotates, each resistance value of the first MR element 71 and the third MR element 73 increases, whereas each resistance value of the second MR element 72 and the fourth MR element 74 decreases, for example.

In the magnetic sensor having the configuration described above, the differential signal S1 on the potential is obtained from the connection points P11 and P12 when the reading current is caused to flow from the power source vcc1 to the first to the fourth MR elements 71 to 74. Thus, the rotational angle θ of the signal magnetic field Hm from a reference position can be obtained based on the differential signal S1.

As in the embodiments described above, the magnetic sensor according to the third embodiment has the configuration in which the first connecting line L71 and the second connecting line L72 three-dimensionally cross each other in the central region R1 positioned between each pair of the first to the fourth MR elements 71 to 74, in an electrically-insulated manner from each other. This makes it possible to shorten the lengths of the first connecting line L71 and the third connecting line L73 in the in-plane direction as compared with an example where the first connecting line L71 and the second connecting line L72 do not cross each other. This also makes it possible to improve the symmetric property around the central point CP relating to the resistance of wiring including the first to the sixth connecting lines L71 to L76 in the magnetic sensor as a whole. For these reasons, it is possible to decrease the resistance by reducing the area occupied by the first to the sixth connecting lines L71 to L76, and to decrease variations of the mutual resistance. Therefore, it is possible to achieve downsizing of the entire configuration while maintaining good detection property of the rotational angle θ of the signal magnetic field Hm (limited only to the range of the rotational angle θ from zero degrees to 360 degrees both inclusive) and good reliability of the detecting operation.

By combining two magnetic sensors according to the third embodiment, it is possible to fulfill a function which is the same as that of the magnetic sensor of the first embodiment. That is, a first magnetic sensor as a full-bridged circuit generating a sine wave signal (Sin signal) and a second magnetic sensor as a cosine wave signal (Cos signal) may be used so as to arrange at different position in a space respectively and combine. In that case, compared to the first embodiment, the third embodiment is suitable for using a space effectively because two full-bridged circuits are able to be decentrally-arranged.

It is to be understood that the above description is intended to be illustrative and not restrictive. Many embodiments and modifications will be apparent to those of skill in the art upon reviewing the above description. For example, in the above-described first embodiment, the difference detecting section (difference detectors AMP1 and AMP2) that determines the potential difference at each middle point (connecting points P1, P2, P5, and P6) in the first and second bridge circuits is provided. However, such a difference detecting section may not be provided, in other words, the difference detection may be not performed and the angle is directly calculated from each potential. Alternatively, the difference detection may be performed in the angle calculating circuit.

In addition, in the above described embodiments, a tunnel MR element has been described as a MR element. However, a CPP type GMR element may be employed, for example. In such a case, the intermediate layer may be replaced by a high-conductive non-magnetic material layer such as copper (Cu), gold (Au), or chrome (Cr), instead of a tunnel barrier layer.

Moreover, in the above described embodiments, the magnetic sensor used as an angle sensor that detects a direction of a signal magnetic field rotating on a rotational plane (surface in parallel to a stacked layer surface of a MR element) has been described as an example. However, the magnetic sensor of the embodiments can be used as a magnetic sensor that detects a magnitude of a signal magnetic field applied in a certain direction.

It should be appreciated that variations may be made in the described embodiments by persons skilled in the art without departing from the scope of the invention as defined by the following claims. The limitations in the claims are to be interpreted broadly based on the language employed in the claims and not limited to examples described in the specification or during the prosecution of the application, and the examples are to be construed as non-exclusive. For example, in the disclosure, the term "preferably", "preferred" or the like is non-exclusive and means "preferably", but not limited to. The use of the terms first, second, etc. do not denote any order or importance, but rather the terms first, second, etc. are used to distinguish one element from another. Moreover, no element or component in the disclosure is intended to be dedicated to the public regardless of whether the element or component is explicitly recited in the following claims.

This application is based on and claims priority from Japanese Patent Application No. 2009-176828, filed in the Japan Patent Office on Jul. 29, 2009, the disclosure of which is hereby incorporated by reference herein in its entirety.

What is claimed is:

1. A magnetic sensor comprising a bridge circuit including first to fourth magneto-resistive elements arranged on a substrate so as to surround a central region, wherein
  one end of the first magneto-resistive element and one end of the second magneto-resistive element are connected to each other through a first connecting portion linearly extending in the central region positioned between the first magneto-resistive element and the second magneto-resistive element,
  one end of the third magneto-resistive element and one end of the fourth magneto-resistive element are linearly extended and connected to each other through a second connecting portion that crosses the first connecting portion in the central region positioned between the third magneto-resistive element and the fourth magneto-resistive element, other end of the first magneto-resistive element is connected to other end of the fourth magneto-resistive element through a third connecting portion, other end of the second magneto-resistive element is connected to other end of the third magneto-resistive element through a fourth connecting portion, resistance values of the first and third magneto-resistive elements change in a same increasing or decreasing direction depending on a change of an external signal magnetic field, and resistance values of the second and fourth magneto-resistive elements change in a increasing or decreasing direction opposite to that of the first and third magneto-resistive elements depending on the change of the signal magnetic field.

2. The magnetic sensor according to claim 1, further comprising a difference detecting section detecting a potential difference between the first connecting portion and the second connecting portion when a voltage is applied between the third connecting portion and the fourth connecting portion.

3. The magnetic sensor according to claim 1, further comprising an angle calculating circuit calculating a rotational angle of the signal magnetic field based on potentials at the first and the second connecting portions when a voltage is applied between the third connecting portion and the fourth connecting portion.

4. A magnetic sensor comprising first to eighth magneto-resistive elements arranged on a substrate so as to surround a central region, the first to fourth magneto-resistive elements configuring a first bridge circuit, the fifth to eighth magneto-resistive elements configuring a second bridge circuit, wherein one end of the first magneto-resistive element and one end of the second magneto-resistive element are connected to each other through a first connecting portion extending in the central region positioned between the first magneto-resistive element and the second magneto-resistive element, one end of the third magneto-resistive element and one end of the fourth magneto-resistive element are connected to each other through a second connecting portion extending in the central region positioned between the third magneto-resistive element and the fourth magneto-resistive element, other end of the first magneto-resistive element is connected to other end of the fourth magneto-resistive element through a third connecting portion, other end of the second magneto-resistive element is connected to other end of the third magneto-resistive element through a fourth connecting portion, resistance value of the first and third magneto-resistive elements changes in a same increasing or decreasing direction depending on a change of an external signal magnetic field, resistance value of the second and fourth magneto-resistive elements changes in a increasing or decreasing direction opposite to that of the first and third magneto-resistive elements depending on the change of the signal magnetic field, one end of the fifth magneto-resistive element and one end of the sixth magneto-resistive element are connected to each other through a fifth connecting portion that crosses the first and second connecting portion with a distance in a thickness direction in the central region positioned between the fifth magneto-resistive element and the sixth magneto-resistive element, one end of the seventh magneto-resistive element and one end of the eighth magneto-resistive element are connected to each other through a sixth connecting portion that crosses the first and second connecting portion with a distance in a thickness direction in the central region positioned between the seventh magneto-resistive element and the eighth magneto-resistive element, other end of the fifth magneto-resistive element is connected to other end of the eighth magneto-resistive element through a seventh connecting portion, other end of the sixth magneto-resistive element is connected to other end of the seventh magneto-resistive element through a eighth connecting portion, resistance values of the fifth and seventh magneto-resistive elements change in a same increasing or decreasing direction depending on the change of the signal magnetic field, and resistance values of the sixth and eighth magneto-resistive elements change in a increasing or decreasing direction opposite to that of the fifth and seventh magneto-resistive elements depending on the change of the signal magnetic field.

5. The magnetic sensor according to claim 4, further comprising a difference detecting section detecting a first differential signal based on a potential difference between the first connecting portion and the second connecting portion when a voltage is applied between the third connecting portion and the fourth connecting portion, as well as detecting a second differential signal based on a potential difference between the fifth connecting portion and the sixth connecting portion when a voltage is applied between the seventh connecting portion and the eighth connecting portion.

6. The magnetic sensor according to claim 4, further comprising an angle calculating circuit calculating a rotational angle of the signal magnetic field, based on potentials at the first and second connecting portion when a voltage is applied between the third connecting portion and the fourth connecting portion, and based on potentials at the fifth and sixth connecting portions when a voltage is applied between the seventh connecting portion and the eighth connecting portion.

7. The magnetic sensor according to claim 4, wherein each of the first to eighth connecting portions is configured of a single straight-line segment, or combination of a plurality of straight-line segments connected so as to be mutually orthogonal.

8. The magnetic sensor according to claim 4, wherein
the first and second connecting portions extend in parallel to each other,
the fifth and sixth connecting portions extend in a direction orthogonal to the first and second connecting portions.

9. The magnetic sensor according to claim 4, wherein the first to eighth magneto-resistive elements are positioned at a same distance from the central point of the central region.

10. The magnetic sensor according to claim 4, wherein
the first and third magneto-resistive elements are diagonally positioned with reference to the central point of the central region,
the second and fourth magneto-resistive elements are diagonally positioned with reference to the central point of the central region,
the fifth and seventh magneto-resistive elements are diagonally positioned with reference to the central point of the central region, and the sixth and eighth magneto-resistive elements are diagonally positioned with reference to the central point of the central region.

11. The magnetic sensor according to claims 4, wherein
each of the first to eighth magneto-resistive elements includes a plurality of magneto-resistive films arranged on the substrate and conductors connecting the magneto-resistive films in series,
the conductors include a plurality of upper electrodes and lower electrodes, each pair of an upper electrode and an lower electrode, in the plurality of upper electrodes and lower electrodes, sandwiching a respective magneto-resistive film in a layer stacking direction so that the upper electrode and the lower electrode face each other and are in contact with an upper surface and a bottom surface of each magneto-resistive film, respectively, and
each of the upper electrode and the lower electrode extends along an arrangement direction of magneto-resistive films.

12. The magnetic sensor according to claim 11, wherein
the magneto-resistive films and the conductors in the first, fifth, third, and seventh magneto-resistive elements are provided at rotationally-symmetrical positions around the central point of the central region, and
the magneto-resistive films and the conductors in the fourth, eighth, second and sixth magneto-resistive elements are provided at rotationally-symmetrical positions around the central point of the central region.

13. The magnetic sensor according to claim 11, further comprising
a first lead line having one end connected to the first connecting portion,
a second lead line having one end connected to the second connecting portion,
a third lead line having one end connected to the fifth connecting portion, and
a fourth lead line having one end connected to the sixth connecting portion, wherein
one of the first and second lead lines extends between the fifth magneto-resistive element and the eighth magneto-resistive element, and other of the first and second lead lines extends between the sixth magneto-resistive element and the seventh magneto-resistive element, and
one of the third and fourth lead lines extends between the first magneto-resistive element and the fourth magneto-resistive element, and other of the third and fourth lead lines extends between the second magneto-resistive element and the third magneto-resistive element.

14. The magnetic sensor according to claim 13, wherein
the first and second lead lines are positioned on a same straight line,
the third and fourth lead lines are positioned on a same straight line orthogonal to the first and second lead lines,
the magneto-resistive films in the first to fourth magneto-resistive elements are connected to one another along a direction where the third and fourth lead lines extend, and
the magneto-resistive films in the fifth to eighth magneto-resistive elements are connected to one another along a direction where the first and second lead lines extend.

15. The magnetic sensor according to claim 4, wherein
each of the magneto-resistive films in the first to eighth magneto-resistive elements includes, in order, a magnetization pinned layer, a non-magnetic intermediate layer, and a magnetization free layer in which a magnetization direction changes depending on the signal magnetic field,
each of the magnetization pinned layers in the first and third magneto-resistive elements has a magnetization pinned in a first direction,
each of the magnetization pinned layers in the second and fourth magneto-resistive elements has a magnetization pinned in a second direction which is anti-parallel to the first direction,
each of the magnetization pinned layers in the fifth and seventh magneto-resistive elements has a magnetization pinned in a third direction which is orthogonal to the first and second directions, and
each of the magnetization pinned layer in the sixth and eighth magneto-resistive elements has a magnetization pinned in a fourth direction which is anti-parallel to the third direction.

16. A magnetic sensor comprising first to fourth magneto-resistive elements arranged on a substrate so as to surround a central region, wherein
one end of the first magneto-resistive element and one end of the second magneto-resistive element are connected to each other through a first connecting portion extending in the central region positioned between the first magneto-resistive element and the second magneto-resistive element,
one end of the third magneto-resistive element and one end of the fourth magneto-resistive element are connected to each other through a second connecting portion that crosses the first connecting portion in the central region positioned between the third magneto-resistive element and the fourth magneto-resistive element,
other end of the first magneto-resistive element is connected to a first power source and other end of the third magneto-resistive element is connected to a second power source different from the first power source,
other end of the second magneto-resistive element and other end of the fourth magneto-resistive element are both grounded,
a resistance value of the first magneto-resistive element changes in an increasing or decreasing direction opposite to that of the second magneto-resistive elements depending on a change of an external signal magnetic field, and
a resistance value of the third magneto-resistive element changes in an increasing or decreasing direction opposite to that of the fourth magneto-resistive elements depending on the change of the signal magnetic field.

17. The magnetic sensor according to claim 16, further comprising an angle calculating circuit calculating a rotational angle of the signal magnetic field, based on a potential at the first connecting portion when a voltage is applied between other end of the first magneto-resistive element and other end of the second magneto-resistive element, and based on a potential at the second connecting portion when a voltage is applied between other end of the third magneto-resistive element and other end of the fourth magneto-resistive element.

* * * * *